United States Patent [19]

Smelser et al.

[11] Patent Number: 4,817,095

[45] Date of Patent: Mar. 28, 1989

[54] BYTE WRITE ERROR CODE METHOD AND APPARATUS

[75] Inventors: Donald W. Smelser, Bolton; James C. Stegeman, Acton; Lawrence A. Chisvin, Sudbury, all of Mass.

[73] Assignee: Digital Equipment Corporation, Maynard, Mass.

[21] Appl. No.: 50,839

[22] Filed: May 15, 1987

[51] Int. Cl.$^4$ .............................. G06F 11/10
[52] U.S. Cl. .......................... 371/38; 371/13
[58] Field of Search ............................ 371/13, 38, 51; 365/200

[56] References Cited

U.S. PATENT DOCUMENTS

| | | | |
|---|---|---|---|
| 4,319,357 | 3/1982 | Bossen | 371/38 |
| 4,458,349 | 7/1984 | Aichelmann | 371/13 |
| 4,523,314 | 6/1985 | Burns | 371/38 |
| 4,641,310 | 2/1987 | Martens | 371/13 X |

Primary Examiner—Jerry Smith
Assistant Examiner—Robert W. Beausoliel
Attorney, Agent, or Firm—Finnegan, Henderson, Farabow, Garrett, & Dunner

[57] ABSTRACT

A method and apparatus for error detection is disclosed. A data word and its check bits are read from memory, and new check bits are generated form the data word read. A logical operation is performed between the new check bits and the check bits read from memory to generate a syndrome. The syndrome is decoded to detect the presence or absence of an uncorrectable error. If an uncorrectable error is detected, a logical operation is performed between the new check bits and a byte write error code to generate a third set of check bits, which are then written into memory along with the data word.

36 Claims, 8 Drawing Sheets

ERROR CORRECTION CODE (ECC) ⟋70

| DATA BIT | S0 | S1 | S2 | S3 | S4 | S5 | S6 | S7 |
|---|---|---|---|---|---|---|---|---|
| 0  | 0 | 0 | 0 | 0 | 0 | 1 | 1 | 1 |
| 1  | 1 | 0 | 0 | 0 | 0 | 0 | 1 | 1 |
| 2  | 0 | 1 | 0 | 0 | 0 | 0 | 1 | 1 |
| 3  | 1 | 1 | 0 | 0 | 0 | 0 | 0 | 1 |
| 4  | 0 | 0 | 1 | 0 | 0 | 0 | 1 | 1 |
| 5  | 1 | 0 | 1 | 0 | 0 | 0 | 0 | 1 |
| 6  | 0 | 1 | 1 | 0 | 0 | 0 | 0 | 1 |
| 7  | 1 | 1 | 1 | 0 | 0 | 0 | 0 | 0 |
| 8  | 0 | 0 | 0 | 1 | 0 | 0 | 1 | 1 |
| 9  | 1 | 0 | 0 | 1 | 0 | 0 | 0 | 1 |
| 10 | 0 | 1 | 0 | 1 | 0 | 0 | 0 | 1 |
| 11 | 1 | 1 | 0 | 1 | 0 | 0 | 0 | 0 |
| 12 | 0 | 0 | 1 | 1 | 0 | 0 | 0 | 1 |
| 13 | 1 | 0 | 1 | 1 | 0 | 0 | 0 | 0 |
| 14 | 0 | 0 | 0 | 1 | 1 | 0 | 1 | 0 |
| 15 | 1 | 0 | 0 | 0 | 1 | 0 | 1 | 0 |
| 16 | 0 | 0 | 0 | 0 | 1 | 0 | 1 | 1 |
| 17 | 1 | 0 | 0 | 0 | 0 | 1 | 0 | 1 |
| 18 | 0 | 1 | 0 | 0 | 0 | 1 | 0 | 1 |
| 19 | 1 | 1 | 0 | 0 | 0 | 0 | 1 | 0 |
| 20 | 0 | 0 | 1 | 0 | 0 | 1 | 0 | 1 |
| 21 | 1 | 0 | 1 | 0 | 0 | 0 | 1 | 0 |
| 22 | 0 | 1 | 1 | 0 | 0 | 0 | 1 | 0 |
| 23 | 1 | 1 | 1 | 0 | 0 | 0 | 1 | 1 |
| 24 | 0 | 0 | 0 | 1 | 0 | 1 | 0 | 1 |
| 25 | 1 | 0 | 0 | 1 | 0 | 0 | 1 | 0 |
| 26 | 0 | 1 | 0 | 1 | 0 | 0 | 1 | 0 |
| 27 | 1 | 1 | 0 | 1 | 0 | 0 | 1 | 1 |
| 28 | 0 | 0 | 1 | 1 | 0 | 0 | 1 | 0 |
| 29 | 1 | 0 | 1 | 1 | 0 | 0 | 1 | 1 |
| 30 | 0 | 0 | 0 | 1 | 1 | 1 | 0 | 0 |
| 31 | 1 | 0 | 0 | 0 | 1 | 1 | 0 | 0 |
| 32 | 0 | 0 | 0 | 0 | 1 | 1 | 0 | 1 |
| 33 | 1 | 0 | 0 | 0 | 0 | 1 | 1 | 0 |
| 34 | 0 | 1 | 0 | 0 | 0 | 1 | 1 | 0 |
| 35 | 1 | 1 | 0 | 0 | 0 | 1 | 0 | 0 |
| 36 | 0 | 0 | 1 | 0 | 0 | 1 | 1 | 0 |
| 37 | 1 | 0 | 1 | 0 | 0 | 1 | 0 | 0 |
| 38 | 0 | 1 | 1 | 0 | 0 | 1 | 0 | 0 |
| 39 | 1 | 1 | 1 | 0 | 0 | 1 | 0 | 1 |

FIG. 3 (cont.)

| | | | | | | | | |
|---|---|---|---|---|---|---|---|---|
| 40 | 0 | 0 | 0 | 1 | 0 | 1 | 1 | 0 |
| 41 | 1 | 0 | 0 | 1 | 0 | 1 | 0 | 0 |
| 42 | 0 | 1 | 0 | 0 | 1 | 0 | 1 | 0 |
| 43 | 1 | 1 | 0 | 1 | 0 | 1 | 0 | 1 |
| 44 | 0 | 0 | 1 | 1 | 0 | 1 | 0 | 0 |
| 45 | 1 | 0 | 1 | 1 | 0 | 1 | 0 | 1 |
| 46 | 0 | 0 | 1 | 0 | 1 | 0 | 1 | 0 |
| 47 | 1 | 0 | 0 | 1 | 1 | 0 | 0 | 0 |
| 48 | 0 | 0 | 0 | 0 | 1 | 1 | 1 | 0 |
| 49 | 1 | 0 | 0 | 0 | 1 | 0 | 0 | 1 |
| 50 | 0 | 1 | 0 | 0 | 1 | 0 | 0 | 1 |
| 51 | 1 | 1 | 0 | 0 | 1 | 0 | 0 | 0 |
| 52 | 0 | 0 | 1 | 0 | 1 | 0 | 0 | 1 |
| 53 | 1 | 0 | 1 | 0 | 1 | 0 | 0 | 0 |
| 54 | 0 | 1 | 1 | 0 | 1 | 0 | 0 | 0 |
| 55 | 1 | 1 | 1 | 0 | 1 | 0 | 0 | 1 |
| 56 | 0 | 0 | 0 | 1 | 1 | 0 | 0 | 1 |
| 57 | 1 | 0 | 0 | 1 | 0 | 1 | 1 | 1 |
| 58 | 0 | 1 | 0 | 0 | 1 | 1 | 0 | 0 |
| 59 | 1 | 1 | 0 | 1 | 1 | 0 | 0 | 1 |
| 60 | 0 | 0 | 1 | 1 | 1 | 0 | 0 | 0 |
| 61 | 1 | 0 | 1 | 1 | 1 | 0 | 0 | 1 |
| 62 | 0 | 0 | 1 | 0 | 1 | 1 | 0 | 0 |
| 63 | 1 | 0 | 0 | 1 | 1 | 0 | 1 | 1 |
| C0 | 1 | 0 | 0 | 0 | 0 | 0 | 0 | 0 |
| C1 | 0 | 1 | 0 | 0 | 0 | 0 | 0 | 0 |
| C2 | 0 | 0 | 1 | 0 | 0 | 0 | 0 | 0 |
| C3 | 0 | 0 | 0 | 1 | 0 | 0 | 0 | 0 |
| C4 | 0 | 0 | 0 | 0 | 1 | 0 | 0 | 0 |
| C5 | 0 | 0 | 0 | 0 | 0 | 1 | 0 | 0 |
| C6 | 0 | 0 | 0 | 0 | 0 | 0 | 1 | 0 |
| C7 | 0 | 0 | 0 | 0 | 0 | 0 | 0 | 1 |
| BYTE WRITE ERROR CODE | 0 | 1 | 1 | 1 | 1 | 1 | 1 | 1 |

BYTE WRITE ERROR CODE METHOD AND APPARATUS

BACKGROUND OF THE INVENTION

The present invention pertains to the field of error detection and correction in a digital computer. More particularly, this invention relates to error detection and correction during a partial write to memory operation and the marking of a memory location as erroneous when an uncorrectable error occurs during a partial write to memory operation.

Prior art error detection techniques make it possible to detect whether data read from a computer memory contains one or more errors. Furthermore, prior art error correction techniques make it possible in certain situations to correct data read from a computer memory if that data contains one or more errors.

Certain error detection and correction techniques are described in pages 199 to 207 of the textbook *Introduction to Switching Theory and Logical Design* by F. J. Hill and G. R. Peterson (2nd Ed. 1974). The Hamming Code is an example of a prior art error detecting and correcting code.

In prior art systems using the Hamming Code, certain binary parity check bits, also simply referred to as check bits, are associated with each binary data word. In one prior art system, each check bit is selected to establish even parity over that bit and a certain subset of the bits of the data word. In an even parity system, the total number of ones (or zeros) in a permissible code is always an even number. In an odd parity system, the total number of ones (or zeros) in a permissible code is always an odd number. Prior art systems using the Hamming Code include either even or odd parity systems.

In the above described prior art system using the Hamming Code, each parity check bit results from an exclusive or logical operation between certain selected bits of the data word, the result being the establishment of even parity over the parity check bit and a certain subset of the bits of the data word. Each parity check bit then becomes part of the set of parity check bits associated with that particular data word.

That data word together with its check bits could then, for example, be transmitted from one system to another over a communications line or written into a dynamic random access memory ("DRAM") and then read sometime later from the DRAM. In the interim between sending and receiving, in the case of transmission of the data word, or between reading and writing, in the case involving a DRAM, single or multiple bit errors could occur in the parity check bits and the data words.

The Hamming Code is employed in certain prior art systems to detect or correct errors once the data word is received after transmission or a read from memory.

The incorporation of known error detection and correction methods as part of a partial write operation (or a system employing a partial write operation) has severe limitations, however. In one known partial write operation, one of the objects is to replace a subset of old data stored as a data word with new data—thereby replacing old data with new data and creating a new data word—and then writing the new data word into memory. Known partial write methods involve reading a data word together with its check bits from memory. If the check bits indicate the presence of a single bit error in the data word just read—in other words, a correctable error is detected—then the single bit error is corrected using known methods and apparatuses. A subset of old data that makes up the data word that has been read from memory is then replaced with new data and a new data word is created. That new data word is then written in the memory.

Limitations regarding the known partial write method and apparatus involve the situation when the check bits that are read indicate an uncorrectable error in the data word read from memory. One prior art method was to then abort the partial write operation and terminate the cycle of which the partial write was intended to be a part. In other words, no data—new or old—is written back into memory.

Another prior art method employed for the uncorrectability situation is to write the old failed data word and its old check bits, which indicate an uncorrectable error, back into memory. The partial write operation is thus aborted given that the new data is never merged with the old data. The computer cycle is not terminated, however. This prior art method is based on the hope that the old failed data word and check bits rewritten into memory will remain uncorrectable over time. The disadvantage of this prior art method and apparatus is that, if another error or transient occurs, the same memory location may not produce an uncorrectable error on the next memory read operation during which an erroneous data word will be falsely perceived as correct or correctable.

SUMMARY AND OBJECTS OF THE INVENTION

In view of the limitations of known partial write methods and devices, one of the objectives of the present invention is to provide an improved method and apparatus for handling the occurrence of uncorrectable errors during a memory operation, including a partial write operation, in a digital computer system that includes memory.

A further objective of the invention is to provide an improved method and apparatus for marking a memory location as associated with an uncorrectable error when an uncorrectable error occurs during a memory operation, including a partial write operation. The method and apparatus of the present invention ensures within the realm of reasonable probability that a memory location with an uncorrectable error detected during a memory operation will subsequently be detected as being associated with an uncorrectable error in the event that the uncorrectable error was in the nature of a transient or soft error.

Another objective of the present invention is (1) to provide, in many instances, an indication that a failed memory operation (including a failed partial write) has occurred at a particular memory location or address and (2) to provide, within the realm of reasonable probability, an indication that there is an uncorrectable error at a particular memory location or address after a failed memory operation (including a failed partial write operation), even if a subsequent transient or error occurs at that particular memory location after a failed memory operation. The first situation occurs when no subsequent error occurs at a particular memory location by the time of the next read operation from that location. The second situation occurs when a subsequent error occurs at a particular memory location after a failed memory operation, including a failed partial write operation.

Another objective of this invention is to provide an error correction code that assures within the realm of reasonable probability that an uncorrectable error will be detected after a failed memory operation, including a failed partial write operation, occurs.

These and other objects of the invention are provided for by a method for error detection which includes reading a data word and its check bits from memory, and generating a new set of check bits from the data word that has been read. A logical operation is performed between the new check bits and the check bits read from memory, and the result of that logical operation is a syndrome. The syndrome is decoded to detect the presence or absence of an uncorrectable error. If an uncorrectable error is detected, a logical operation is performed between the new check bits and a byte write error code. The result of that logical operation is a new set of check bits, replacing the previous check bits and written into memory along with the data word. In this way, the byte write error code provides a mark or signature for that particular memory location.

In accordance with the present invention, a method for error detection also includes reading a data word and its check bits from memory. A new set of check bits is generated from the data word that has been read from memory. A logical operation is performed between the new set of check bits and the check bits read from memory, the result of that logical operation being a syndrome. A failed memory operation is indicated if the syndrome corresponds to the byte write error code.

The above-mentioned objects and other objects of the invention are also provided for by an apparatus that provides means for performing the above methods.

Additional objects and features of the invention will appear from the following description in which the preferred embodiments have been set forth in detail in connection with the accompanying drawings.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Figure 1:
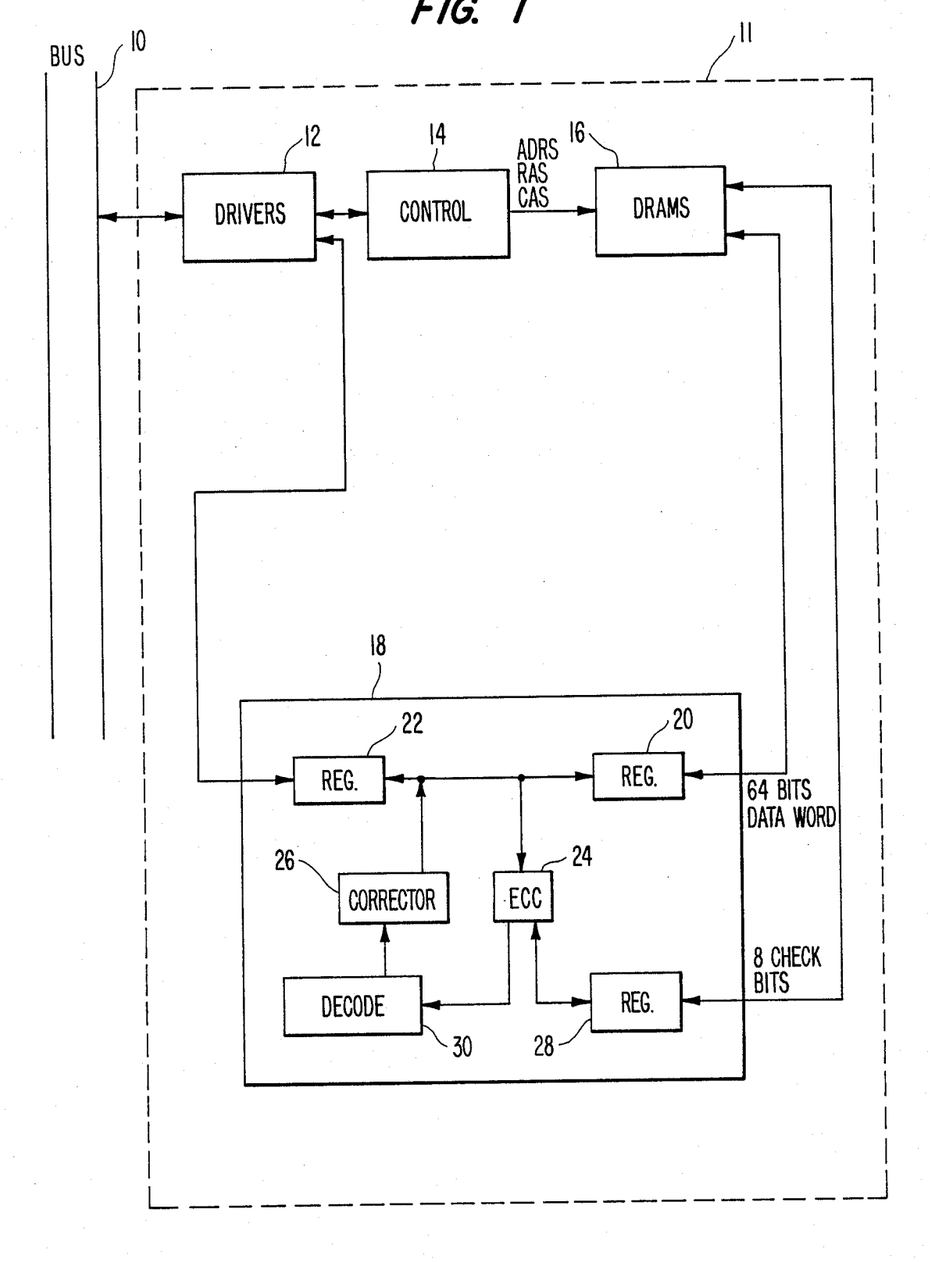
FIG. 1 is a block diagram of an embodiment for error detection according to the invention.

With reference to the drawings, FIG. 1 illustrates the basic error detection apparatus in block diagram form. The bus 10 provides a path for data to be transferred throughout many parts of the computer system. Memory system 11 connects with bus 10 through the drivers 12, and data can flow to or from bus 10 through drivers 12. Control 14 contains circuitry to interface to and observe the protocol of bus 10. Control 14 also contains circuitry to control the operation of the dynamic random access memories ("DRAMS") 16. This includes control 14 providing signals including address ("ADRS"), row address strobe ("RAS"), and column address strobe ("CAS").

In one embodiment of the present invention, memory system 11 can be a memory board for use in a data processing system. In another embodiment of the present invention, the memory system 11 for use in a data processing system has at least one memory board.

Data to be written into memory from bus 10 passes from bus 10 through drivers 12 and through data path 18 and into DRAMs 16. Data to be read from the DRAMs onto the bus passes from DRAMs 16 through data path 18 and through drivers 12 and onto bus 10.

Data path 18 contains error detection and correction circuitry for the data. Register 20 stores data read from and to be written into DRAMs 16. Register 22 stores data that is received from and to be sent to drivers 12. Register 28 stores parity check bits read from and to be written into DRAMs 16.

Error correction code ("ECC") circuitry 24 provides the capability for generating parity check bits for data words and for providing syndromes for data words. The operation of ECC circuitry 24 will be described in more detail below.

Decode 30 contains circuitry to decode the syndromes produced by ECC circuitry 24. If a syndrome decoded by decode 30 indicates the presence and location of a correctable error in the data, the corrector 26 corrects the bit of the data word that is in error. For example, if a bit should be a 1 rather than a 0, corrector changes the bit from a 0 to a 1. The corrector can of course also change a 1 to a 0.

Figure 2:
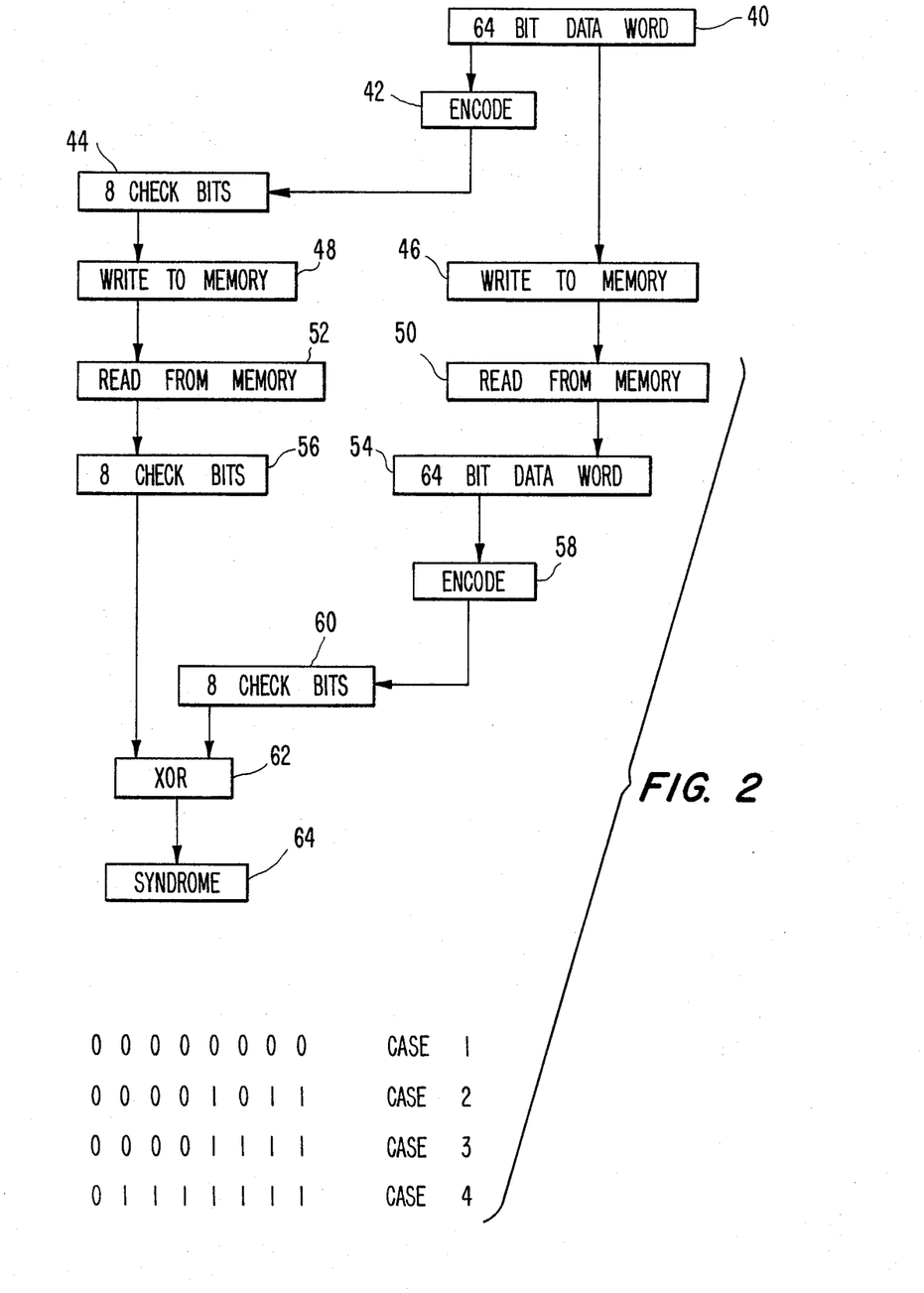
FIG. 2 illustrates a method for producing a syndrome.
Figure 3:
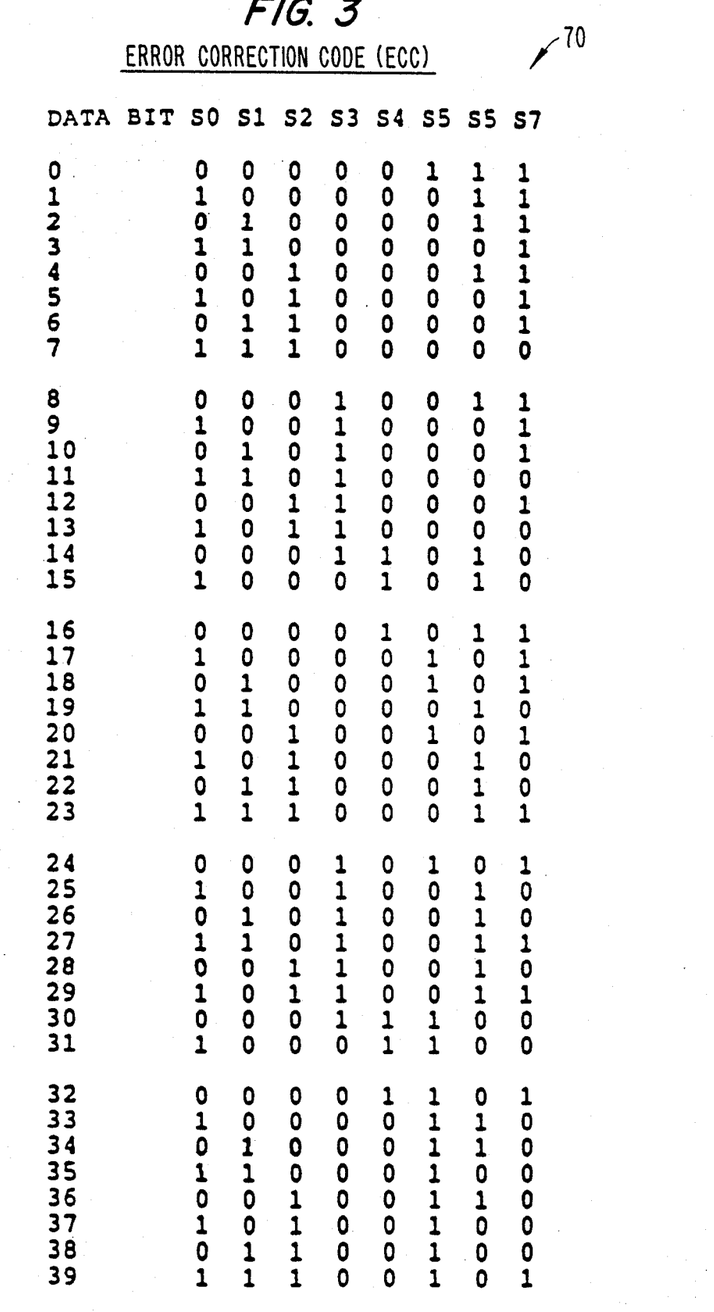
FIG. 3 shows the error correction code, including the byte write error code.

FIG. 2 sets forth a method for error detection and correction that could be used in conjunction with the apparatus of FIG. 1. A 64 bit data word 0 is encoded at encode step 42 to produce 8 check bits 44 associated or linked with data word 40. The production of check bits 44 from data word 40 is done according to an error correcting code ("ECC"). FIG. 3 sets forth ECC 70, which is a modified Hamming Code to be used as an ECC in an embodiment of the present invention. Each check bit of the set of check bits is generated by an exclusive-OR ("XOR") operation between certain data word bits determined by ECC 70. By reference to ECC 70 of FIG. 3, one can see which data word bits determine which check bits. Each check bit has its own column in ECC 70. Each "one" in the column for the check bit of interest lines up with a bit position of a data word. The data word bit positions so associated with the "ones" in the column of interest become the pertinent bit positions. For example, for check bit S2, the pertinent data word bit positions are 4–7, 12–13, 20–23, 28–29, 36–39, 44–46, 52–55, and 60–62. A check bit is generated by an exclusive-OR operation between the data in the pertinent bit positions of the data word. For this example, check bit S2 is generated by an exclusive-OR operation between the data in bit positions 4–7, 12–23, 20–23, 28–29, 36–39, 44–46, 52–55, and 60–62 of a data word.

ECC 70 of FIG. 3 has the power to detect and correct single bit errors and the power to detect (but not correct) double bit errors.

Other embodiments of the present invention could have shorter or longer data words and check bits; that is, the data words and check bits could have fewer bits or more bits. The minimum number of check bits is of course related to the length of the data word. For example, a 32 bit data word would require 7 check bits and a 16 bit data word would require 6 check bits.

The 64 bit data word is then written to a particular address or location in the memory at the "write to memory" step 6. The memory could, for example, include the DRAMs 16 of FIG. 1. The 8 parity check bits are written to a particular address or location in the memory at the "write to memory" step 48.

The 8 parity check bits 44 could be written into memory at the same memory address as that of the 64 bit data word 40. The check bits 44 could be interleaved at various points throughout a 72 bit word at that memory address, or grouped together within that 72 bit word. That 72 bit word would be composed of the 8 check bits 44 and the 64 bit data word 40. The 8 check bits 44 could also appear as the 8 leftmost bits of a 72 bit data word composed of the 8 check bits 44 and the 64 bit data word 40. Alternatively, the 8 check bits 44 could be stored at a memory address different from the memory address at which the 64 bit data word 40 is stored in memory, yet nevertheless be associated or linked to the data word 40. In other words, check bits 44 would be identified as the check bits for data word 40.

A 64 bit data word 54 is then read from memory at the "read from memory" step 50. The data word 54 is read from the same memory address that data word 40 was written to. The 8 parity check bits 56 are also read from memory at the "read from memory" step 52. The check bits 56 are read from the same memory address to which check bits 44 were written.

If no errors occur in the data word, then data word 40 should be identical to data word 54. In addition, if no errors occur in the check bits, then check bits 56 should be identical to check bits 44.

Nevertheless, errors do sometimes occur in data words and check bits in the interim between (1) the "write to memory" steps 46 and 48 and (2) the "read from memory" steps 50 and 52.

Figure 4:
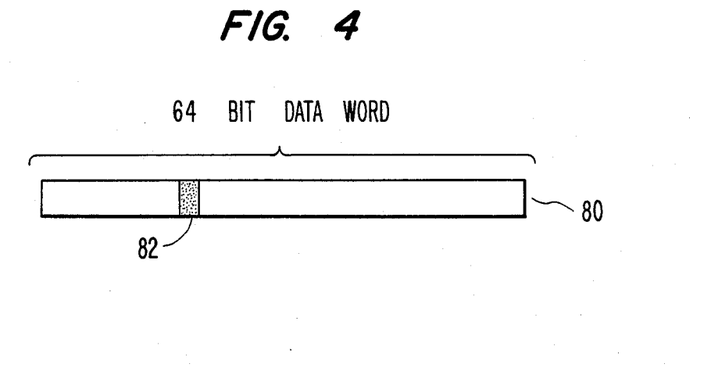
FIG. 4 illustrates a correctable error.
Figure 5:
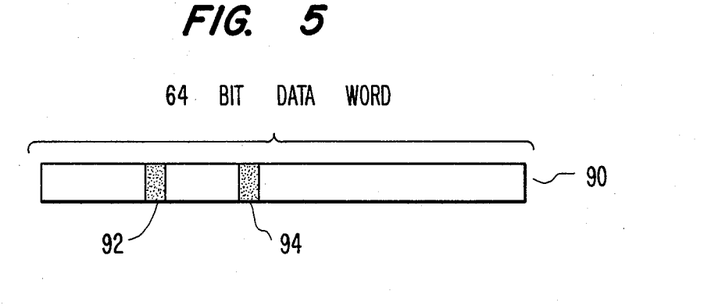
FIG. 5 illustrates an uncorrectable error.

Errors can also occur in data words and check bits while the data words and check bits are stored in registers, and also during transmission or transfer of the data words and check bits. Bit errors can be caused by many factors, including voltage transients, alpha particle effects in the DRAMs, and the loss of charge. Single bit errors are much more likely to occur than two bit errors. Two bit errors are much more likely to occur than three bit errors, and so forth, with the probabilities decreasing as the number of bits in error increases. FIG. 4 illustrates the presence of a single bit error 82 in 64 bit data word 80. The bit in error could of course be any of the 64 bits of the data word 80. FIG. 5 illustrates two bit errors 92 and 94 in 64 bit data word 90.

One or more bit errors could mean that data word 54 is different from data word 40, or that check bits 56 are different from check bits 44. One object is to detect whether a single-bit error has occurred in data word 54 and to correct that single-bit error. A single-bit error is referred to as a correctable error under ECC 70 of FIG. 3. Another object is to detect whether a two-bit error has occurred in data word 54, although this embodiment of the present invention does not allow the correction of two bit errors. A two-bit error is therefore referred to as an uncorrectable error under ECC 70 of FIG. 3.

Assuming that one or more of the bits of data word 54 differ from the corresponding bits of data word 40, then check bits 56 would not be the correct check bits for the data pattern found in data word 54 (assuming that check bits 56 remain the same as check bits 44 after the write to and the read from memory).

Regardless of whether or not data word 54 is in error, data word 54 is encoded at encode step 44 so as to produce 8 parity check bits 60.

Encode step 58 is performed in the same manner as encode step 42—that is, check bits are generated in accordance with the ECC of FIG. 3.

Check bits 60 will differ from check bits 56 if either (1) check bits 44 differ from check bits 56, (2) data word 54 differs from data word 40, or (3) errors occurred in the creation, transmission, or storage of check bits 44, 56, or 60. Check bits 60 will thus differ from check bits 56 if there has been one or more errors in the bits of either the data word or the check bits.

An exclusive-OR logical operation (or its logical equivalent) is performed at step 62 between each of the bits of check bits 60 and each counterpart bit occupying the same position in check bits 56. Thus 8 exclusive-OR operations are performed given that there are 8 bits in each of check bits 60 and 56; one exclusive-OR operation per bit is performed.

The result of exclusive-OR step 62 is a syndrome 64. Assuming that there are no errors involving three or more bits, which is within the realm of reasonable probability, then the syndrome 64 indicates:

(1) whether there has been no error;
(2) whether there has been a correctable error, and if so, the location within the data word or the check bits of the bit in error;
(3) whether there has been an uncorrectable error; and
(4) whether there has been a failed partial write, discussed below.

As discussed above, the assumption of no errors involving three or more bits of the data word is a reasonable assumption given the extremely low probability of the occurrence of errors involving three bits or more. Errors involving three or more bits are beyond the power of the ECC 70 of FIG. 3.

Case 1 in FIG. 2 shows the syndrome 64 that is generated when there are no errors in either the data word or the check bits. The Case 1 no-error condition is thus having all the bits of the syndrome being zero.

Case 2 in FIG. 2 shows an example of the syndrome 64 that is generated when there is a correctable error (i.e., single-bit error) in the data word 54 or the 8 check bits 56. The parity of the syndrome is odd in Case 2. The syndrome shown as Case 2 also indicates the location within the data word 54 of the bit in error. One can see which bit of data word 54 is in error by reference to the ECC 70 chart of FIG. 3. The particular syndrome 00001011 of Case 2 matches the pattern for data bit 16 on the ECC 70 of FIG. 3, so the syndrome of Case 2 indicates that data bit 16 of data word 54 is in error. Once one knows which data bit of the data word 50 is in error, correction of that single bit is relatively straightforward—if the erroneous bit is a 0, then it is changed to a 1; if the erroneous bit is a 1, then it is changed to a 0.

Other syndromes are possible for the correctable error situation. For the ECC 70 of FIG. 3, correctable errors would be indicated if the syndrome generated matched the bit pattern for the rows of ECC 70 labeled data bit 0 through 63 for data, or C0 through C7 for check bits. By matching a syndrome with a data pattern of ECC 70 and reading the bit number for the row wherein the match occurs, one can tell which data bit of data word 54 is in error.

Case 3 shown in FIG. 2 illustrates an example of a syndrome 64 that is generated when there is an uncorrectable error (i.e., a two-bit error) in the data word 54 or the check bits. If the parity of the syndrome is even, then there is an uncorrectable error. For Case 3, four bits are ones, so there is even parity. Other syndromes having even parity are possible for the uncorrectable error situation. A syndrome with odd parity could also indicate an uncorrectable error if the syndrome matches an unused code of ECC 70.

Again, the assumption here is that there are no errors involving 3 or more bits in any data word. If an error involving an odd number of bits besides one did occur, however, then the syndrome generated would have odd parity, and it would be possible that the syndrome would falsely indicate the presence of a correctable error.

If an error involving an even number of bits besides zero but including two did occur, then the syndrome generated would have even parity, and would correctly identify the presence of an uncorrectable error in either the data word 54 or the check bits 56 or 60.

Case 4 shown in FIG. 2 illustrates the syndrome that is generated when a failed partial write operation has occurred, which is discussed in more detail below. The syndrome for Case 4 corresponds to the byte write error code of ECC 70 illustrated in FIG. 3.

Figure 6:
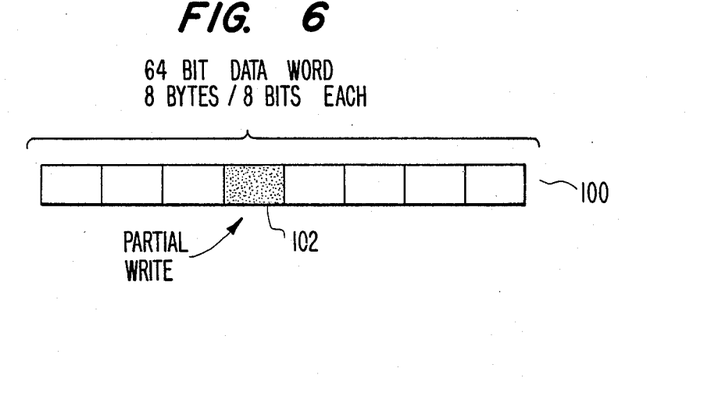
FIG. 6 illustrates the result of a partial write operation.

In a partial write operation, one of the objectives is to replace a subset of the old data stored as a data word with new data, and thus an objective of a partial write operation is to replace old data by merging new data with old data. FIG. 6 illustrates a 64 bit data word 100 composed of 8 bytes of data, each byte being 8 bits in length. In one example of a successful partial write operation, the data previously in byte 102 of data word 100 is replaced with new data. The data in the other bytes of data word 100 nevertheless remains unchanged after the partial write operation is performed.

With reference to the apparatus of FIG. 1, a partial write process involves reading a 64 bit data word from a memory address or location in the DRAMs 16 and storing that data word in register 20. The 8 check bits associated with that data word are also read from a memory address or location in the DRAMs 16 and stored in register 28. The byte (or bytes) that is intended to be written into the data word passes from bus 10 through drivers 12 and is stored in register 22.

As discussed above, other embodiments of the present invention could have shorter or longer data words and check bits. Furthermore, the check bits could appear at the same memory address used by the data word, or in other embodiments, at a different memory address from that used by the data word, so long as the check bits are associated with the data word. Moreover, in some embodiments of the present invention the check bits could be interleaved throughout a data word, and in certain other embodiments the check bits could be grouped together and appear either separate from a data word or appear as a part of a longer data word.

Figure 7:
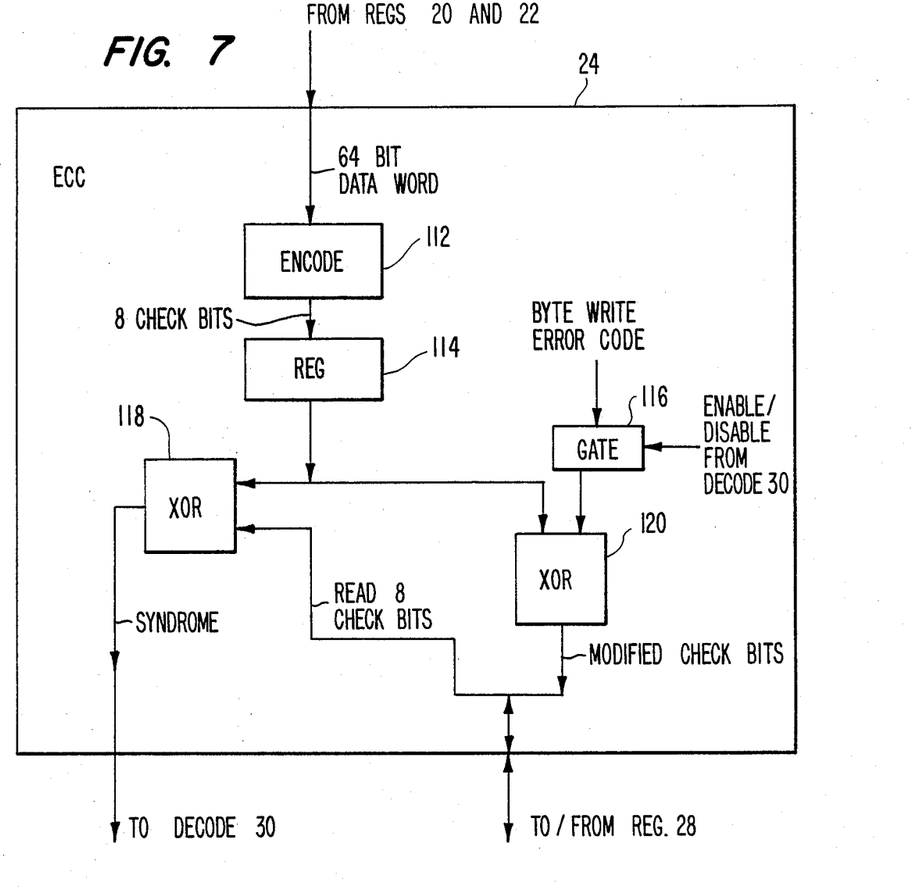
FIG. 7 illustrates in more detail the error correction code circuitry according to the invention.

The data word stored in register 20 is inputted into the encode circuitry 112 of the ECC circuitry 24 shown in FIG. 7. The encode circuitry 112 generates 8 check bits for the data word from register 20. The check bits are generated in the manner described above in connection with FIG. 2. Thus each check bit of the set of check bits is generated by an exclusive-OR operation between certain data word bits determined by EEC 70. The resulting 8 check bits are stored in register 114.

The newly created check bits stored in register 114 and the 8 check bits stored in register 28 (i.e., the check bits associated with the data word that is to be modified and that were read from memory) are then inputted into exclusive-OR circuitry 118. Exclusive-OR circuitry 118 generates a syndrome by performing an exclusive-OR logical operation between corresponding bits of each set of check bits inputted into the exclusive-OR circuitry 118. The syndrome generated could be one of the types of syndromes discussed above in connection w1th FIG. 2.

The syndrome generated by exclusive-OR circuitry 118 is then inputted into decode circuitry 30 of FIG. 1. The decode circuitry 30 performs logical operations on the syndrome to determine:

(1) whether there is no error in the data word stored in register 20 or the check bits stored in register 28;
(2) whether the data stored in registers 20 and 28 has a correctable error, and if so, the location within that data of the bit in error;
(3) whether the data stored in registers 20 and 28 has an uncorrectable error; and
(4) whether a failed partial write operation had earlier occurred.

The assumption is made, however, given the power of ECC 70 of FIG. 3, that there are no errors involving three or more bits of the data word.

If the syndrome decoded by decode circuitry 30 indicates a no-error condition, then the partial write process is completed by replacing the one or more bytes of data stored in register 20 with the data word stored in register 22, generating new check bits in ECC circuitry 24 for the new data word, and writing the resulting new data word and new check bits for the new data word into the DRAMs 16.

If the set of syndromes decoded by decode circuitry 30 indicates a correctable error, then the location within the data word of the error is sent by decode circuitry 30 to corrector circuitry 26. Corrector circuitry 26 corrects single bit error in the data word stored in register 20. After the single-bit error is corrected, the partial write process is completed by replacing the one r more bytes of data stored in register 20 with the data stored in register 22, generating new check bits in ECC circuitry 24 for the new data word, and writing the resulting new data word and new check bits for the new data word into the DRAMS 16.

If the syndrome decoded by the decode circuitry 30 indicates an uncorrectable error during a partial write operation, then, referring to FIG. 7, the decode circuitry 30 of FIG. 1 sends an enable signal to gate 116 of the ECC circuitry 24 illustrated in FIG. 7. By enabling gate 116, the byte write error code of ECC 70 of FIG. 3 is inputted into the exclusive-OR circuitry 120. The 8 check bits stored in register 114 are also inputted into the exclusive-OR circuitry 120.

Exclusive-OR circuitry 120 performs an exclusive-OR logical operation between corresponding bits of the 8 check bits of register 114 and the 8 bits of the byte write error code.

The result of the operation performed by the exclusive-OR circuitry 120 is the generation of a set of modified check bits, containing 8 bits. The set of modified check bits are then transferred from the exclusive-OR circuitry 120 and stored in register 28, replacing the check bits previously stored in register 28.

With reference to FIG. 1, the data word stored in register 20 is written into the DRAMS 16 without any merger or replacement operation being performed with the one or more bytes of data stored in register 22. The set of modified check bits stored in register 28 is also written into the DRAMS 16 so as to be associated with the data word written from register 20 into the DRAMS 16. The partial write process for the data word is therefore aborted and never completed, given that the one or more bytes of data stored in register 22 were never merged with the data word stored in register 20.

Upon the next read or partial write operation, the data word and its check bits are read from the DRAMs 16. The data word is stored in register 20 and the check bits are stored in register 28, illustrated in FIG. 1. The check bits read from the DRAMs 16 and stored in register 28 are the modified check bits now associated with the data word, generated as a result of the earlier failed partial write operation.

According to the method described above with respect to the ECC circuitry 24 shown in FIG. 3, the data word is inputted into encode circuitry 112, 8 check bits are generated by the encode circuitry 112, and the 8 check bits are stored in register 114 and then inputted into exclusive-OR circuitry 118. The set of modified check bits from register 28 are also inputted into exclusive-OR circuitry 118, and a syndrome is generated. The syndrome is then inputted into decode circuitry 30.

If the syndrome sent to the decode circuitry 30 of FIG. 1 corresponds to the byte write error code of ECC 70 of FIG. 3, then decode circuitry 30 provides a signal that would indicate that a failed partial write operation previously occurred with respect to this data word. The syndrome would correspond to the byte write error code of ECC 70 of FIG. 3 if no error occurred in the data word or in the set of modified check bits since the time of the failed partial write operation.

If however, any bit of either the data word or the set of modified check bits changed state from what was written during the aborted partial write operation, then for reasons described below the decode circuitry 30 would most likely decode the syndrome to indicate an error condition. The decode circuitry would then indicate that an uncorrectable error had occurred with respect to the data word.

Thus, the byte write error code serves to mark a memory location as "bad" when an uncorrectable error occurs during a partial write operation. In an alternative embodiment of the present invention, the byte write error code serves to mark a memory location as "bad" when an uncorrectable error occurs during a memory operation.

Assuming no errors involving three or more bits occur, marking a memory location with the byte write error code after failed partial write operation:

(1) provides an indication that a failed partial write operation occurred with respect to that memory address, if no error occurs after the failed partial write operation; and (2) provides with high probability an indication of an uncorrectable error at that memory address, if a single bit error occurs after the failed partial write operation.

The occurrence of a single-bit error in the data word or the modified check bits after the failed partial write occurs will mean that the uncorrectable error condition will be associated with that memory address, rather than a false correctable error condition or a false "no error" condition.

Figure 8:
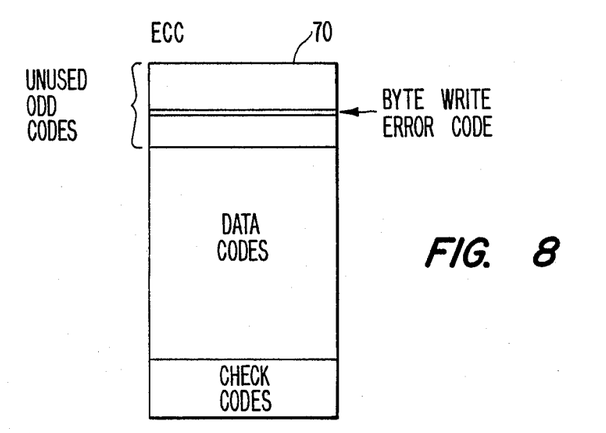
FIG. 8 illustrates the structure of the error correction code.

As illustrated in FIG. 8, the byte write error code of ECC 70 is surrounded by unused odd parity 8-bit codes. The data codes and check codes shown are other codes used as part of ECC 70.

With references to FIG. 8, the particular byte write error code of ECC 70 (shown in FIG. 3) was chosen to be surrounded by unused odd parity 8-bit codes such that the probability is increased that decode circuitry 30 of FIG. 1 would decode a syndrome to indicate an uncorrectable error situation if more than a single-bit error occurs after the failed partial write operation occurs. The ECC codes having a few bits or only one bit different from the byte write error code are uncorrectable error codes to increase the probability of detecting an earlier detected uncorrectable error. In other words the particular byte write error code for ECC 70 shown in FIG. 3 increases the likelihood that an uncorrectable error condition will be indicated if an error involving two or more bits of either the data word or the modified check bits occurs after a failed partial write operation occurs.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method for error detection comprising the steps of:
   (a) reading a data word from a memory;
   (b) reading from the memory a first set of check bits associated with the data word read;
   (c) generating a second set of check bits from the data word that has been read from the memory;
   (d) performing a first logical operation between the first set of check bits and the second set of check bits to generate a syndrome;
   (e) decoding the syndrome in order to detect the presence or absence of an uncorrectable error, and upon the detection of an uncorrectable error, modifying the check bits to indicate such uncorrectable error.

2. The method recited in claim 1, wherein the modification comprises:
   (i) performing a second logical operation between the second set of check bits and a byte write error code to generate a third set of check bits;
   (ii) writing the data word into the memory; and
   (iii) writing the third set of check bits into the memory so as to associate the third set of check bits with the data word.

3. The method recited in claim 2, wherein the first logical operation is an exclusive-OR operation between the first set of check bits and the second set of check bits and wherein the second logical operation is an exclusive-OR operation between the second set of check bits and a byte write error code.

4. The method recited in claim 2, wherein the codes having a few bits or only one bit different from the byte write error code are uncorrectable error codes to increase the probability of detecting an earlier detected uncorrectable error.

5. The method recited in claim 2, wherein the data word is 64 bits in length and wherein each set of the first, second, and third sets of check bits is 8 bits in length.

6. The method recited in claim 5 wherein the byte write error code is 01111111, wherein the left-most bit is the least significant bit and the right-most bit is the most significant bit.

7. The method recited in claim 6, further comprising the step of
  (f) indicating an uncorrectable error if the syndrome corresponds to an error code that indicates an uncorrectable error.

8. A method for error detection comprising the steps of:
  (a) reading a data word from a memory;
  (b) reading from the memory a first set of check bits associated with the data word read from the memory;
  (c) generating a second set of check bits from the data word that has been read from the memory;
  (d) performing a logical operation between the first set of check bits and the second set of check bits to generate a syndrome; and
  (e) indicating a failed memory operation if the syndrome corresponds to a byte write error code.

9. The method recited in claim 8 further comprising the step of
  (f) indicating an uncorrectable error if the syndrome corresponds to an error code that indicates an uncorrectable error.

10. The method recited in claim 9, wherein the byte write error code is surrounded by unused error codes such that the probability is increased that an uncorrectable error will be indicated if more than a single-bit error occurs after a failed memory operation.

11. A method for error detection comprising the steps of:
  (a) reading a data word from a memory;
  (b) reading from the memory a first set of check bits associated with the data word read from the memory;
  (c) generating a second set of check bits from the data word that has been read from the memory;
  (d) performing a first logical operation between the first set of check bits and the second set of check bits to generate a syndrome;
  (e) decoding the syndrome in order to detect the presence or absence of an uncorrectable error, and upon the detection of an uncorrectable error during a partial write operation,
  (i) performing a second logical operation between the second set of check bits and a byte write error code to generate a third set of check bits;
  (ii) writing the data word into the memory;
  (iii) writing the third set of check bits into the memory so as to associate the third set of check bits with the data word.

12. A method for error detection comprising the steps of:
  (a) reading a data word from a memory;
  (b) reading from the memory a first set of check bits associated with the data word read from the memory;
  (c) generating a second set of check bits from the data word that has been read from the memory;
  (d) performing a logical operation between the first set of check bits and the second set of check bits to generate a syndrome;
  (e) indicating a failed partial write operation if the syndrome corresponds to a byte write error code.

13. An apparatus for error detection comprising:
  (a) means for reading a data word from a memory;
  (b) means for reading from the memory a first set of check bits associated with the data word read from the memory;
  (c) means for generating a second set of check bits from the data word that has been read from the memory;
  (d) means for performing a first logical operation between the first set of check bits and the second set of check bits to generate a syndrome;
  (e) means for decoding the syndrome in order to detect the presence or absence of an uncorrectable error;
  (f) means for performing, after the detection of an uncorrectable error, a second logical operation between the second set of check bits and a byte write error code to generate a third set of check bits;
  (g) means for writing, after the detection of an uncorrectable error, the data word into in the memory;
  (h) means for writing, after the detection of an uncorrectable error, the third set of check bits into the memory so as to associate the third set of check bits with the data word.

14. The apparatus recited in claim 13, wherein the first logical operation is an exclusive-OR operation between the first set of check bits and the second set of check bits and wherein the second logical operation is an exclusive-OR logical operation between the second set of check bits and a byte write error code.

15. The apparatus recited in claim 13, wherein the codes having a few bits or only one bit different from the byte write error code are uncorrectable error codes to increase the probability of detecting an earlier detected uncorrectable error.

16. The apparatus recited in claim 13, wherein the data word is 64 bits in length and wherein each set of first, second, and third sets of check bits is 8 bits in length.

17. The apparatus recited in claim 16, wherein the byte write error code is 01111111, wherein the left-most bit is the least significant bit and the right-most bit is the most significant bit.

18. An apparatus for error detection comprising:
  (a) means for reading a data word from a memory;
  (b) means for reading from the memory a first set of check bits associated with the data word read from the memory;
  (c) means for generating a second set of check bits from the data word that has been read from the memory;
  (d) means for performing a logical operation between the first set of check bits and the second set of check bits to generate a syndrome; and
  (e) means for indicating a failed memory operation if the syndrome corresponds to a byte write error code.

19. The apparatus recited in claim 14, further comprising:
  (f) means for indicating an uncorrectable error if the syndrome corresponds to an error code that indicates an uncorrectable error.

20. The apparatus recited in claim 19, wherein the codes having a few bits or only one bit different from the byte write error code are uncorrectable error codes to increase the probability of detecting an earlier detected uncorrectable error.

21. A memory board for use in a data processing system and having error detection capability, comprising:
(a) memory means for storing a plurality of data words;
(b) means for reading a first one of the data words from the memory means;
(c) means for reading form the memory means a first set of check bits associated with the first data word;
(d) means for generating a second set of check bits from the first data word;
(e) means for performing a first logical operation between the first set of check bits and the second set of check bits to generate a syndrome;
(f) means for decoding the syndrome in order to detect the presence of an uncorrectable error;
(g) means for performing, after the detection of an uncorrectable error, a second logical operation between the second set of check bits and a byte write error code to generate a third set of check bits;
(h) means for writing, after the detection of an uncorrectable error, the first data word into the memory means;
(i) means for writing, after the detection of an uncorrectable error, the third set of check bits into the memory means so as to associate the third set of check bits with the first data word.

22. The memory board recited in claim 21, wherein the first logical operation is an exclusive-OR operation between the first set of check bits and the second set of check bits and wherein the second logical operation is an exclusiveOR logical operation between the second set of check bits and a byte write error code.

23. The memory board recited in claim 21, wherein the codes having a few bits or only one bit different from the byte write error code are uncorrectable error codes to increase the probability of detecting an earlier undetected uncorrectable error.

24. The memory board recited in claim 21, wherein the data word is 64 bits in length and wherein each set of first, second, and third sets of check bits is 8 bits in length.

25. The memory board recited in claim 24, wherein the byte write error code is 01111111, wherein the left-most bit is the least significant bit and the right-most bit is the most significant bit.

26. A memory board for use in a data processing system and having error detection capability, comprising:
(a) memory means for storing a plurality of data words;
(b) means for reading a first one of the data words from the memory means;
(c) means for reading from the memory means a first set of check bits associated with the first data word;
(d) means for generating a second set of check bits from the first data word;
(e) means for performing a logical operation between the first set of check bits and the second set of check bits to generate a syndrome;
(f) means for indicating a failed memory operation if the syndrome corresponds to a byte write error. code.

27. The memory board recited in claim 26, further comprising:
(f) means for indicating an uncorrectable error if the syndrome corresponds to an error code that indicates an uncorrectable error.

28. The memory board recited in claim 27, wherein the codes having a few bits or only one bit different from the byte write error code are uncorrectable error codes to increase the probability of detecting an earlier detected uncorrectable error.

29. An error detecting memory system, for use in a data processing system having a data bus,
(a) means for receiving data words from the data bus;
(b) means for generating check bits for each of the received data words;
(c) memory means for storing the received data words and the generated check bits;
(d) means for reading a first one of the data words from the memory means;
(e) means for reading from the memory means a first set of check bits associated with the first data word;
(f) means for generating a second set of check bits from the first data word;
(g) means for performing a first logical operation between the first set of check bits and the second set of check bits to generate a syndrome;
(h) means for decoding the syndrome to detect the presence of an uncorrectable error;
(i) means for performing, after the detection of an uncorrectable error, a second logical operation between the second set of check bits and a byte write error code to generate a third set of check bits;
(j) means for writing, after the detection of an uncorrectable error, the first data word into the memory means;
(k) means for writing, after the detection of an uncorrectable error, the third set of check bits into the memory means so as to associated the third set of check bits with the first data word.

30. The memory system recited in claim 29, further comprising:
(f) means for indicating an uncorrectable error if the syndrome corresponds to an error code that indicates an uncorrectable error.

31. The memory system recited in claim 30, wherein the codes having a few bits or only one bit different from the byte write error code are uncorrectable error codes to increase the probability of detecting an earlier detected uncorrectable error.

32. The memory system recited in claim 29, wherein the first logical operation is an exclusive-OR operation between the first set of check bits and the second set of check bits and wherein the second logical operation is an exclusive-OR logical operation between the second set of check bits and a byte write error code.

33. The memory system recited in claim 29, wherein the codes having a few bits or only one bit different from the byte write error code are uncorrectable error codes to increase the probability of detecting an earlier detected uncorrectable error.

34. The memory system recited in claim 29, wherein the data word is 64 bits in length and wherein each set of first, second, and third sets of check bits is 8 bits in length.

35. The memory system recited in claim 34 wherein the byte write error code is 01111111, wherein the left-most bit is the least significant bit and the right-most bit is the most significant bit.

36. An error detecting memory system, for use in a data processing system having a data bus, comprising:
   (a) means for receiving data words from the data bus;
   (b) means for generating check bits for each of the received data words;
   (c) memory means for storing the received data words and the generated check bits;
   (d) means for reading a first one of the data words from the memory means;
   (e) means for reading from the memory means a first set of check bits associated with the first data word;
   (f) means for generating a second set of check bits from the first data word;
   (g) means for performing a logical operation between the first set of check bits and the second set of check bits to generate a syndrome;
   (h) means for indicating a failed memory operation if the syndrome corresponds to a byte write error code.

* * * * *

UNITED STATES PATENT AND TRADEMARK OFFICE
CERTIFICATE OF CORRECTION

PATENT NO. : 4,817,095
DATED : March 28, 1989
INVENTOR(S) : Donald W. Smelser et al.

It is certified that error appears in the above-identified patent and that said Letters Patent is hereby corrected as shown below:

Claim 1, line 48, after "the" insert --second set of--.

Claim 21, line 13, delete "form" insert --from--.

Claim 22, line 39, after "exclusive" insert -- - --.

Claim 29, line 15, after "bus" insert --comprising:--.

Claim 29, line 42, delete "associated" insert --associate--.

Signed and Sealed this

Twelfth Day of December, 1989

Attest:

JEFFREY M. SAMUELS

*Attesting Officer*    *Acting Commissioner of Patents and Trademarks*